Dec. 29, 1970 J. M. SCHROEDER 3,550,261

METHOD OF BONDING AND AN ELECTRICAL CONTACT CONSTRUCTION

Filed Nov. 13, 1967

JON M. SCHROEDER
INVENTOR.

BY Gordon H Telfer

ATTORNEY

United States Patent Office 3,550,261
Patented Dec. 29, 1970

3,550,261

METHOD OF BONDING AND AN ELECTRICAL CONTACT CONSTRUCTION

Jon M. Schroeder, Palm Beach Gardens, Fla., assignor to Fairchild Camera and Instrument Corporation, Syosset, N.Y., a corporation of Delaware Filed Nov. 13, 1967, Ser. No. 682,193
Int. Cl. B01j *17/00;* H01l *7/66*
U.S. Cl. 29—583 7 Claims

ABSTRACT OF THE DISCLOSURE

A method is disclosed for batch forming extended beam leads to the pads or contact areas of a solid state device (e.g., monolithic integrated circuit hybrid integrated circuit, discrete device) whereby external connections to the device may be made. The process involves depositing a metal or a plurality of metals over the device in a predetermined manner with the metal adhering to the device contact area but only weakly, if at all, adhering to the remainder of the surface. The device is separated by backside scribing which leaves the beams extending from the contact area of each device.

BACKGROUND OF THE INVENTION

Field of the invention

This invention relates to a method of forming an electrical connection to a semiconductor chip.

Description of the prior art

Integrated circuits require external electrical connections for the purpose of supplying power, for the purpose of interconnecting a number of circuits together, and for various other purposes. To provide for such connections a number of areas of conductive material (e.g., aluminum film), referred to as pads, are associated with each circuit. These pads are usually placed around the perimeter of the circuit to allow maximum density and flexibility of interconnection of the components of the circuit. Each pad provides sufficient area so that a conventional lead wire may be connected to it by a common bonding technique such as ultrasonic bonding or thermocompression bonding.

In the prior art as stated, the pads have been located outside the area occupied by the circuit components. Such location of the pads substantially increases the total area of the integrated circuit limiting the maximum component density obtainable. The number of circuits that may be batch processed in a single operation by such fabrication equipment as diffusion furnaces and photographic masking jigs is, in part, determined by the area of each integrated circuit. Thus, the increase in area of an integrated circuit attributable to the pad area decidedly limits integrated circuits production output.

Another disadvantage of such prior art methods is that the pad area does not contain any underlying circuit components. This is because pressure is required to bond the wires to the pad itself which pressure might damage underlying components. Thus, the area on which the pads are located is employed strictly as a support in prior art methods. In some arrangements the pad area may occupy as much as 40% of the integrated circuit.

One prior art method eliminates a large amount of the pad area waste by providing conductive pads that may be folded over onto the substrate. This method has the disadvantage that the bonding of electrical connections must be carefully controlled as too much pressure damages underlying substrates or components. Such a method also requires an extra layer of insulating material.

SUMMARY OF THE INVENTION

The subject invention reduces the area required for an integrated circuit and provides a batch method for bonding a lead to an integrated circuit. This enables an electrical connection to be made to an integrated circuit without further wiring or other electrical connection.

Briefly, the invention comprises a method of forming an electrical connection to a device comprising the steps of providing at least one conductive contact area on the surface of a device; masking said device such that predetermined open strip configurations are coincident with said metallic contact pad and extend longitudinally therefrom on the device surface and onto the surface of an adjacent device chip; depositing a first layer of conductive selectively adhering material, said material adhering to said contact area but not adhering to said device surface.

One of the advantages of the invented method is that devices may be placed directly under the contact pad or area. Heretofore, the dangers of excess strain on the device during bonding, prohibited this, however, in the present invention external connection is made to extended conductive fingers or beams and no pressure is placed on the contact pads themselves. Hence, more useable area is to be had for the same chip size. The contact pads may be made smaller as they are no longer required to have a size sufficient to receive a wire.

Another advantage of the present invention is that all external leads may be bonded at once. It is no longer necessary to bond contact wires to individual pads. Furthermore, the extended beams may be formed from simple metal system by vacuum evaporation requiring no etching or other processing step.

The novel features which are believed to be characteristic of the invention, both as to its organization and method of operation, together with future objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

DESCRIPTION OF THE PREFERRED EMBODIMENT

The extended beam lead technique of providing electrical connections to semiconductor devices is equally applicable to single discrete devices as well as integrated circuits such as shown in U.S. patent application Ser. No. 582,814, filed Sept. 29, 1966, by B. Frescura et al., and assigned to assignee of this application. In the preferred embodiment of the invention the extended beam lead and the process relating thereto is described in connection with an integrated circuit.

Figures 1A, 1B, 1C, 1D:
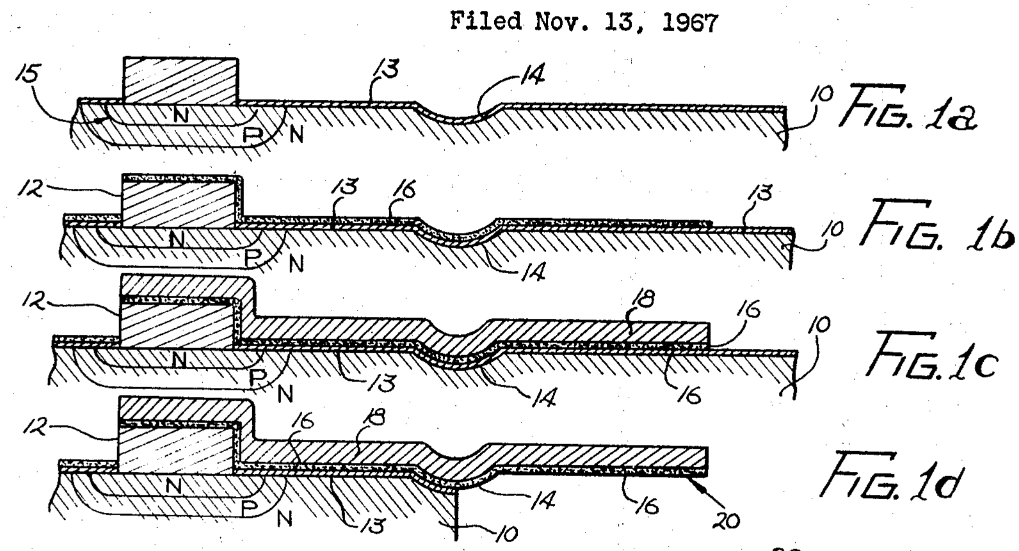
FIGS. 1A to 1D illustrate in diagrammatic form the method of providing extended beam leads on a substrate or device surface.

Referring now to FIG. 1A, there is provided a substrate or device 10 which may be a monolithic silicon chip having a scribe line 14 thereon for separating the chips into two or more devices. A passivating or protective layer 13 such as $SiO_x$ may cover the surface of the device 10. To connect a number of circuits together and to connect one device to another device, a conductive contact or pad 12 is associated with one of the circuits or components 15 which is formed in accordance with well known techniques as described in U.S. Pat. 2,981,877 to Robert N. Noyce and assigned to the assignee of this invention. The pad 12 is placed directly over and in electrical contact with component 15 via an aperture in layer 13. The pad 12 may conveniently be two mils wide by two mils long and made of aluminum. (Prior art conductors usually employ pad 5 x 5 mils in order to receive a wire.) Any suitable conductive material, however, may be used as pad 12. The forming of a device and pad as shown in FIG. 1A is by conventional techniques. Normally a discrete device or integrated circuit has a plurality of regions on which conductive pads are positioned and to which extended beam leads in accordance with this invention may be simultaneously formed. For simplicity, the description proceeds primarily with reference to the formation of a beam lead to the single illustrated conductive pad 12.

Figure 2:
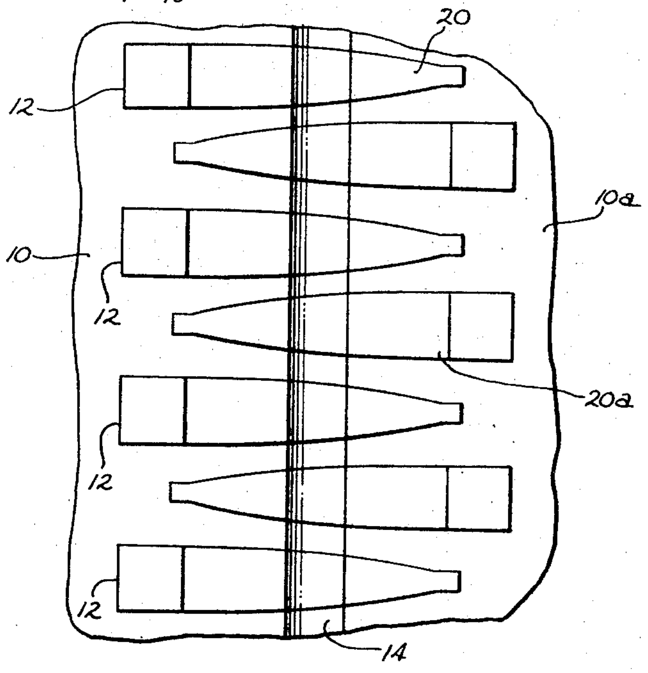
FIG. 2 is a top view in diagrammatic form of two neighboring device chips having multiple extended beam leads; and, FIG. 3 is a perspective of a beam lead on a device chip.

Next, a layer of material which is selectively adhering is deposited in a pattern on device 10. To accomplish this a mask is placed over the device and is oriented and held down firmly in close contact to the surface of the device. The mask has a cutout extending over and coinciding with contact pad 12 which in configuration resembles a finger, and which has a width at one end about the same as the pad itself. The finger cutout extends over the scribe line 14 and over to an adjoining device 10A (FIG. 2). Thus, the cutout in the mask coincides with aluminum pad 12 and extends therefrom over the protective layer 13.

With the mask in place, the depositing of the selectively adhering material is performed (FIG. 1B). Typically this may be done by a flash evaporation of silver in well known vacuum depositing equipment. The silver may be deposited to a thickness of no less than approximately 500 A. to form layer 16 (FIG. 1B). The layer 16 has the property of nonadherence to $SiO_x$ and of adhering strongly to the pad 12. In addition it is preferred that layer 16 act as a conductor.

Figure 3:
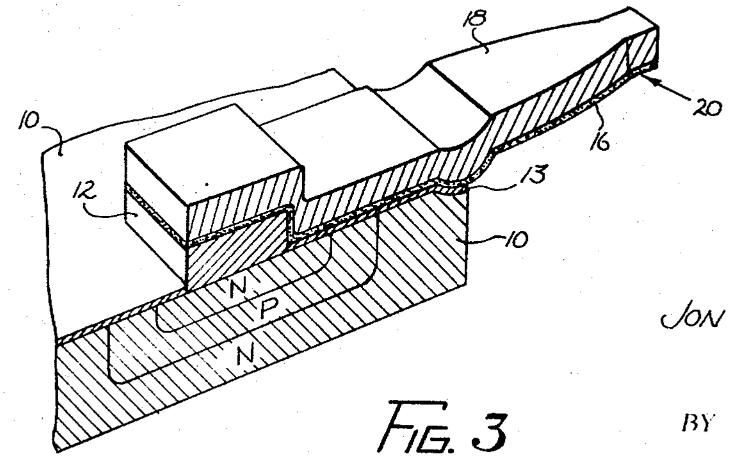

With the mask still in place, a second layer 18 is evaporated to a thickness which may be about 25 microns (FIG. 1C). The second layer 18 is deposited over layer 16. The second layer 18 has the property of adhering well to the first layer and of acting as a conductor when in contact with the first layer. The layer 18 which adheres to layer 16, is a conductive material that is deposited to a predetermined thickness (e.g., no less than 250 microns) to provide additional mechanical strength to the extended beam 20 (FIG. 3).

In one preferred embodiment of the present process invention, the first layer 16 is silver and the second layer 18 is aluminum. Of course, a combination of any two suitable materials may be used or a single material may be used. For example, silver alone may be used for certain applications. The only requirement is that the material adjacent device 10 adhere well to the pad 12 but not adhere to protective layer 13. In certain applications a protective layer may not be used. Thus, the first and second layers are selected (1) for their adhesion to each other, and (2) for the nonadhesion of the first metal to the device surface, (3) for the electrical characteristics, such as resistance, and (4) for their strength characteristics. It should be noted that when aluminum is deposited over silver the bonded aluminum-silver beam has a low electrical resistance, good strength, adhesion to the contact pad and nonadhesion to the device surface. Other materials that may be employed as a substitute for aluminum are chromium, platinum, titanium, molybdenum and gold; other materials that may be used rather than silver (nonadhering to device surface) are gold, antimony and others. It should be understood that the various forms of vacuum deposition, plating and other techniques for forming thin layers of conductive material may be employed.

If several or more devices are treated at the same time, as shown in FIG. 2, when the mask is removed the resultant pattern is represented by a plurality of discrete interdigitated fingers comprising sets 20 and 20A. The fingers of each set extend over the scribe line 14 onto the adjacent devices. The shape of the fingers accommodate the interdigitation.

It is within the scope of the invention to form the layers 16 and 18 by photoengraving processes such as mentioned in previously referred to U.S. Pat. 2,981,877. In addition, it is not necessary that 16 be coincident with layer 18 over the entirety of layer 18. This will be further explained later in the description.

Next, the wafer is backside scribed with the devices separated by mechanical pressure (FIG. 1D). These devices are brittle and break at the scribe line 14. This scribing and breaking results in the forming of extended beams 20 which easily separate from the surface of the adjacent device since there is poor adhesion between the first layer 16 and the device oxide surface 13 over which they extend. Thus, the first layer deposited serves as a release agent for the extended beam. It should be noted, however, that the first layer (e.g., silver) has excellent adhesion to contact pad 12 and the layer 18, thereby forming an integral extended beam which has good electrical and mechanical properties. At this point it can be seen that it is only necessary layer 16 be deposited over surfaces that are to be separated from the lead. For example, insofar as device 10 is concerned layer 16 need only be deposited on device 10'. This enables a minimum of silver to be employed and enables a better mechanical support. This also facilitates the forming of contact 12 and layer 18 simultaneously.

The resulting structure (FIGS. 1D and 3) has extended beams which are connected to the contact pads which are arranged across the width and length of a chip. These extended beams then extend beyond the edge of the chip and away from the area of scribe line 14 which marks the boundary of a device. The masking scheme can be designed to alternate the positions of the pads on neighboring devices so that the extended lead from a pad on one device falls between two adjacent pads on the neighboring device. Such a design is shown in FIG. 2.

The length of the extended leads 20 should be such that the leads overhang the edge of the chip by about 5 mils or more to facilitate other connections. The extended leads have the required mechanical strength when 5 mils in length and when used on a 2 x 2 mil conductive pad. When the metallization mask has been removed and the wafer is back side scribed the chip is ready for connection by means of the extended beams to another adjacent device or circuit, the beams serving the same function as a conventional connecting wire.

It is apparent from the foregoing that the heretofore described process and device has many advantages. One such advantage with respect to extended leads is that all leads may be bonded at once thus eliminating the need for bonding individual wires to each conductive pad. No new processing technology is involved in processing the leads other than the standard techniques of metal evaporation plating etc.

Another significant advantage of the present invention is that devices may now be placed directly under the pads. Heretofore, the danger of excess strain on the device during bonding prohibited this. Where leads extend off the pads, bonding pressures do not affect the components underlying the conductive pads, thus, more useable area is to be had for the same chip size. Higher densities of pads are also possible. If for example, a 2 x 2 mil pad on 5-mil centers is selected, then a 75 x 75 mil chip can accommodate 60 pads with extended leads.

Extended leads also are very economical and lend themselves to mass production.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

What is claimed is:

1. A method of forming an electrical connection to a semiconductor device having an upper and a lower surface comprising the steps of:

scribing a line across a selected portion of the upper surface;

forming a protective, passivating layer over at least a portion of the upper surface, including over the scribe line, while leaving selected portions of the surface exposed;

forming at least one conductive area on a selected exposed portion of the upper surface of the device;

depositing a first layer of conductive selectively adhering material over at least a portion of the contact area and over a portion of the protective, passivating layer, said conductive material adhering to said contact area but not adhering to said protective, passivating layer;

backscribing said device from the lower surface under said scribe line to separate a portion of said device underlying a portion of said first layer, whereby said first layer extends past the remaining portion of said device.

2. The process of claim 1 including the additional step after said first depositing step of depositing a second layer of conductive material over said first layer to adhere thereon and coinciding therewith.

3. The process of claim 2 wherein said layers are formed into a lead having a predetermined configuration by vacuum depositing said layer via a mask.

4. The process of claim 2 wherein said first layer is deposited on a portion of said protective, passivating layer and on said contact area to a thickness of no less than approximately 500 angstroms and said second layer is deposited over said first layer and adhering thereto, said second layer being deposited to a thickness of not less than approximately 25 microns.

5. The process of claim 2 wherein said protective, passivating layer is an oxide, said first layer is silver, and said second layer is aluminum.

6. The process of claim 1 wherein said step of depositing said first layer is performed prior to said step of forming a conductive area so that said contact area extends over said first layer.

7. The process of claim 1 wherein said step of forming a conductive area is first performed with said formed contact area having an area approximately less than said opening.

References Cited

UNITED STATES PATENTS

| | | | |
|---|---|---|---|
| 3,248,779 | 5/1966 | Yuska et al. | 29—626 |
| 3,348,299 | 10/1967 | Knutson | 29—589X |
| 3,364,399 | 1/1968 | Warner | 29—590X |

JOHN F. CAMPBELL, Primary Examiner

R. B. LAZARUS, Assistant Examiner

U.S. Cl. X.R.

29—589, 591